United States Patent
Zhang et al.

(10) Patent No.: US 9,612,272 B2
(45) Date of Patent: Apr. 4, 2017

(54) TESTING MEMORY DEVICES WITH PARALLEL PROCESSING OPERATIONS

(71) Applicant: Advantest Corporation, Tokyo (JP)

(72) Inventors: Xinguo Zhang, Cupertino, CA (US); Michael Jones, San Carlos, CA (US); Ken Hanh Duc Lai, Sunnyvale, CA (US); Edmundo De La Puente, Cupertino, CA (US); Alan S. Krech, Jr., Fort Collins, CO (US)

(73) Assignee: ADVANTEST CORPORATION, Tokyo (JP)

( * ) Notice: Subject to any disclaimer, the term of this patent is extended or adjusted under 35 U.S.C. 154(b) by 353 days.

(21) Appl. No.: 14/191,289

(22) Filed: Feb. 26, 2014

(65) Prior Publication Data

US 2015/0243369 A1 Aug. 27, 2015

(51) Int. Cl.
*G01R 31/26* (2014.01)
*G11C 29/56* (2006.01)

(52) U.S. Cl.
CPC ........ *G01R 31/26* (2013.01); *G11C 29/56008* (2013.01)

(58) Field of Classification Search
None
See application file for complete search history.

(56) References Cited

U.S. PATENT DOCUMENTS

| | | | |
|---|---|---|---|
| 6,553,513 B1 | 4/2003 | Swoboda et al. | |
| 7,275,190 B2 | 9/2007 | Roohparvar | |
| 9,117,553 B2 | 8/2015 | Roohparvar | |
| 2005/0138473 A1 | 6/2005 | Mathew et al. | |
| 2008/0013565 A1 | 1/2008 | Batchelor et al. | |
| 2010/0017760 A1 | 1/2010 | Kapur et al. | |
| 2011/0289349 A1* | 11/2011 | Loeser .................. | G06F 11/10 714/6.24 |
| 2011/0307758 A1* | 12/2011 | Fillingim ............ | G06F 11/1048 714/758 |
| 2013/0080983 A1 | 3/2013 | Craig et al. | |
| 2014/0047281 A1 | 2/2014 | Masuo et al. | |
| 2014/0095946 A1* | 4/2014 | Mozak .................. | G11C 29/56 714/718 |
| 2015/0255176 A1 | 9/2015 | Hyder et al. | |

OTHER PUBLICATIONS

Openmokowiki, NAND bad blocks, http://wiki.openmodo.org/wiki/NAND_bad_blocks; Feb. 10, 2012.
STMicroelectronics, Bad Block Management in NAND Flash Memories, http://www.eetasia.com/ARTICLES/2004NOV/A/2004NOV29_MEM_AN06_PDF?Sources=Download) May 2004.

* cited by examiner

*Primary Examiner* — Paresh Patel

(57) ABSTRACT

An ATE system performs RA over NAND flash memory DUTs. A first UBM captures fresh failure related data from a DUT. A second UBM transmits existing failure related data. A fail engine accesses the stored existing failure related data and generates a failure list based thereon. The storing and the accessing the existing failure related data, and/or the generating the failure list, are performed in parallel contemporaneously in relation to the capturing the fresh data. The generated failure list is queued. A failure processor, which may be operable for controlling the capturing, computes a redundancy analysis based on the queued failure list. The first and second UBMs then ping-pong operably.

20 Claims, 4 Drawing Sheets

Example Parallel RA System 200 - Phase B

Typical conventional RA system 100

Example Parallel RA System 200 - Phase A

Example Parallel RA System 200 - Phase B

TESTING MEMORY DEVICES WITH PARALLEL PROCESSING OPERATIONS

TECHNOLOGY

Embodiments of the present invention relate generally to automated semiconductor testing. More particularly, an example embodiment of the present invention relates to testing memory devices.

BACKGROUND

Automated test equipment (ATE) performs high speed testing on semiconductor devices to verify that the devices function properly during and after their manufacturing processes. Some ATE specializes in testing memory devices. Typical ATE systems input a pattern of test signals or data to a device under test (DUT), measure various test parameters relating to the input signals and compute an evaluation of the measurements and output data, which relate to analyzing the computed evaluation.

ATE systems may comprise automatic electromechanical probe, interface and adapter components. ATE systems may also comprise robotic handler components, which load and arrange multiple DUTs (e.g., mass-produced semiconductor devices) into the ATE at once, unload the tested devices and sort them by quality based on their test results. ATE improves test throughput and thus reduces the amount of time required to perform accurate testing, evaluation and handling of significant numbers of devices at once, which improves manufacturing yield and quality and reduces the costs of producing reliable semiconductor devices. An ATE system may specialize in testing memory.

ATE memory testing is performed using complex, computer-based test algorithms to detect memory faults during the final packaging stages of producing various types of memory devices. "Flash" memory comprises an erasable and reprogrammable non-volatile data storage medium with fast access time for computers, telephones, cameras and other portable or mobile electronics.

NAND (NOR/AND) type flash memory is page based, uses consecutive read operations in its input/output (I/O) ports and is less expensive and longer lasting (e.g., in relation to write and erase cycles) than NOR type flash memory, which uses random access and is typically used with computer BIOS (basic input/output system), firmware and other rarely updated applications. Redundancy analysis (RA), also referred to as "repair analysis," of NAND flash memory comprises a significant function of their testing and feature of memory ATE, also referred to herein as a memory tester.

For example, NAND flash memories comprise at least a main block of memory cells and at least a spare block of memory cells, each of which functions with its own page buffer unit. The memory tester writes one or more given patterns of digital test signal data to each cell of the main cell block through the main page buffer and reads the test pattern back out therefrom to detect any errors, which would each indicate a defective cell. The spare block of memory cells provide redundancy for the cells of the main block of cells.

A repair controller is operable to map cell addresses in the spare block with the main block address of a failed cell therein and outputs a redundancy (e.g., repair) control signal to direct data writes to the spare cells, in lieu of writes to the failed main block cell to which the spare block address was mapped. The repair controller may be operable for optimizing the mapping between the main block and the spare block, thus increasing the degree of redundancy. RA thus allows a memory tester to evaluate and analyze the self-repair capability of NAND flash DUTs, which may significantly improve the yield and quality of their manufacture and production.

Test performance (e.g., speed and throughput) and cost comprise significant factors in RA. High NAND flash test throughput may be provided by tester-per-site ATE comprising multiple test sites, in each of which a single DUT is tested at a time. Each of the multiple test sites has its own independent test resources, which comprise a testing processor, an algorithmic test pattern generator, parametric measurement units, buffer memory and fail memory.

As the storage capacity of memory devices grows, the memory requirements of ATE also grow to store the data that is read out of a memory DUT. Large memory capacity however increases the costs of ATE. As newer memory devices evolve in general, their typical storage capacities have tended to increase significantly. The concomitant demand for more test data capture storage has thus become significant in the design and cost of conventional ATE.

Conventionally, RA is performed within a device main test program. This approach adds latency however, as the main test program devotes its resources to computing RA over a given cell before switching to the next cell to be tested. To reduce test latency and thus improve performance, some memory testers comprise a dedicated processor to compute the RA. However, this approach adds the cost of the additional RA processor to the expense of the testing.

Approaches described in this section may, but have not necessarily been conceived or pursued previously. Unless otherwise indicated, approaches mentioned (or issues identified in relation thereto) should not to be assumed as recognized in any prior art merely by inclusion in this section.

SUMMARY

It would be useful to improve the performance of an automated memory test system without the added expense and complexity of large test data storage memory and/or additional or dedicated processor hardware. In particular, it would be useful to improve the speed and throughput of redundancy analysis (RA) without using a dedicated additional processor in its computation.

An embodiment of the present invention relates to testing memory devices with parallel processing operations. An automated test equipment (ATE) system performs redundancy analysis (RA) over one or more NAND flash memory devices under test (DUTs). A first unified buffer memory (UBM) bank captures and stores fresh (e.g. current) failure related data from a DUT. A second UBM bank stores existing failure related data, which it captured previously at an earlier point in time from the DUT. A fail engine accesses the stored existing failure related data from the second UBM and generates a failure list based thereon. The generated failure list is queued (e.g., with a FIFO queue). A failure processing module (e.g., failure processor) computes a RA based on the queued failure list. The failure processor may also control or program the capturing of the failure related data (e.g., a scan over the DUTs, in which a test pattern input to the NAND memory cells generate the failure related data in relation thereto). The first UBM bank and the second UBM bank then switch roles, e.g., "ping-pong."

Thus, an example embodiment of the present invention improves the performance of a memory test system without adding expense and complexity of additional, dedicated processor hardware. An example embodiment is operable for improving the speed and throughput of RA without requiring a dedicated additional or external processor or other components in its computation. An example embodiment also eliminates the need for large test system memory to store the entire contents read out from a DUT at one time.

More specifically, an embodiment of the present invention is directed to a system for testing a device under test, the system comprising a first buffer memory bank operable for capturing fresh failure related data from the device under test at a first time a second buffer memory bank operable for transmitting existing failure related data from a previous DUT test, which precedes the first time a fail engine operable for accessing the existing failure related data and for generating a failure list based thereon, wherein one or more of the receiving the existing failure related data, the accessing the existing failure related data, or the generating a failure list, is performed contemporaneously in relation to the capturing the fresh data a queue operable for queuing the generated failure list; an a failure processor operable for controlling the capturing and for computing a redundancy analysis based on the queued failure list.

Another embodiment of the present invention is directed toward a method for analyzing a redundancy characteristic of one or more devices under test, the method comprising: capturing fresh failure related data from at least one of the one or more devices under test with a first buffer memory at a first time transmitting, from a second buffer memory, existing failure related data, which was captured from the device under test at a previous time, which precedes the first time accessing the existing failure related data generating a failure list based on the accessed existing failure related data, wherein one or more of the receiving the existing failure related data, the accessing the existing failure related data, or the generating a failure list, is performed in parallel contemporaneously in relation to the capturing the fresh data, queuing the generated failure list; and computing a redundancy analysis based on the queued failure list.

BRIEF DESCRIPTION OF THE DRAWINGS

An embodiment of the present invention relates to testing memory devices with parallel processing operations. The accompanying drawings below comprise a part of the specification herein of example embodiments of the present invention and are used for explaining features, elements and attributes thereof. Principles of example embodiments are described herein in relation to each figure (FIG.) of these drawings, in which like numbers are used to reference like items, and in which.

DESCRIPTION OF EXAMPLE EMBODIMENTS

Figure 1:
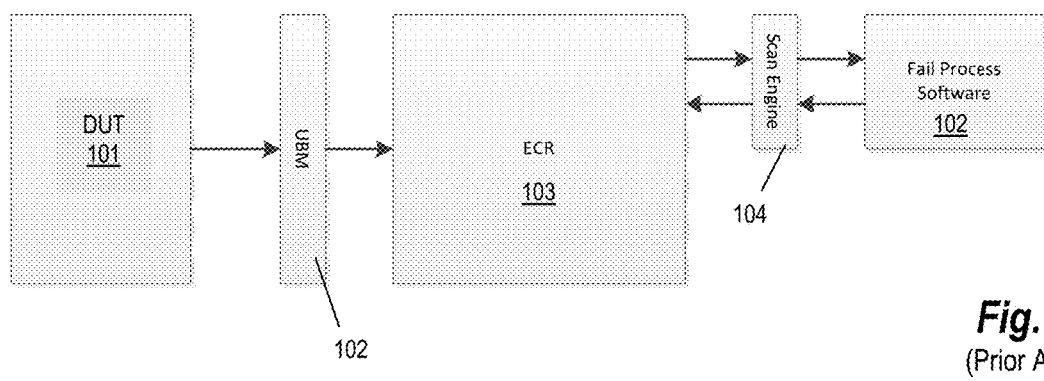
FIG. 1 depicts a conventional RA system.

An embodiment of the present invention relates to parallel memory testing. Reference will now be made in detail to implementations of the example embodiments as illustrated in the accompanying drawings. The same reference numbers will be used to the extent possible throughout the drawings and the following description to refer to the same or like items. It should be apparent to artisans of ordinary skill in technologies that relate to testing memory and other semiconductor devices however, that example embodiments of the present invention may be practiced without some of these specifically described details. Example embodiments of the present invention are described in relation to a parallel redundancy analysis (RA) system for use in testing NAND flash memory.

For focus, clarity and brevity, as well as to avoid unnecessarily occluding, obscuring, obstructing or obfuscating features that may be somewhat more germane to, or significant in explaining example embodiments of the present invention, this description may avoid describing some well-known processes, structures, components and devices in exhaustive detail. Artisans of ordinarily skilled in semiconductor related technologies should realize that the following description is made for purposes of explanation and illustration and is not intended to be limiting in any way. On the contrary; other embodiments should readily suggest themselves to artisans of such skill in relation to the example features and elements described herein and any corresponding benefits such embodiments may achieve. An example embodiment of the present invention is described in relation to a parallel redundancy analysis (RA) system for use in testing NAND flash memory.

While embodiments are described herein with reference to an example RA system, it should be appreciated that this is by way of illustration, example, clarity, brevity and simplicity of description. Moreover, artisans of ordinary skill in arts relating to testing technologies for memories and other semiconductor devices should especially appreciate and understand that the scope of embodiments of the present invention thus covers semiconductor devices more generally than described herein and more particularly, to other integrated circuit (IC) devices that are not dissimilar thereto.

An embodiment of the present invention relates to testing memory devices with parallel processing operations. An automated test equipment (ATE) system performs redundancy analysis (RA) over one or more NAND flash memory devices under test (DUTs). A first unified buffer memory (UBM) bank captures and stores fresh (e.g. current) failure related data from a DUT. A second UBM bank stores existing failure related data, which it captured previously at an earlier point in time from the DUT. A fail engine accesses the stored existing failure related data from the second UBM and generates a failure list based thereon. The generated failure list is queued (e.g., with a FIFO queue). A failure processing module (e.g., failure processor) computes a RA based on the queued failure list. The failure processor may also control or program the capturing of the failure related data (e.g., a scan over the DUTs, in which a test pattern input to the NAND memory cells generate the failure related data in relation thereto). The first UBM bank and the second UBM bank then switch roles, e.g., ping-pong.

FIG. 1 depicts a conventional serial RA system 100. The conventional system 100 has a unified buffer memory (UBM) 102. The UBM 102 is operable for capturing failure related data from a device under test (DUT) 101 such as a NAND flash memory device. The UBM 102 inputs (e.g., writes) the captured failure related data to an error capture RAM (random access memory) ECR 103.

The conventional RA system 100 has a test processor 105 running fail process software, which controls a hardware based scan engine 104. The scan engine 104 reads the failure related data stored in the ECR 103 and generates a fail list under the direction of the driver software running on the test processor 105.

Typically the hardware components UBM 102 and scan engine 104 process some amount of failure data, notify the test controller 105 software when each processing task is completed, and await further instructions from the software. Various interrupts, breaks and interactions occur between the driver software and the hardware scan engine 104 during the running of a given single test pattern.

As resource allocation for storing failure related information may be limited or constrained, the hardware scan engine 104 is typically burdened with scanning ECR 103 to find fail lists. Conventional system 100 thus performs a serialized process, which demands substantial storage resources, such as the rather large ECR memory 103. As newer memory devices evolve in general, their typical storage capacities have tended to increase significantly. The concomitant demand for more ECR storage has thus become significant in the design and cost of conventional ATE. Typically for example, DUT 101 pass/fail data is first read into ECR 103 via the UBM 102. The hardware scan engine then subsequently scans the ECR 103 to generate a fail list for DUT 101.

In contrast to this 'stop-wait-go- . . . ' character of typical conventional system 100, an example embodiment of the present invention processes multiple memory testing functions in parallel with each other. Thus, an example embodiment of the present invention effectively obviates the ECR memory 103. The parallel processing operations of an example embodiment eliminates a requirement for routine use of ECR components in ATE.

Example RA System

Figure 2A:
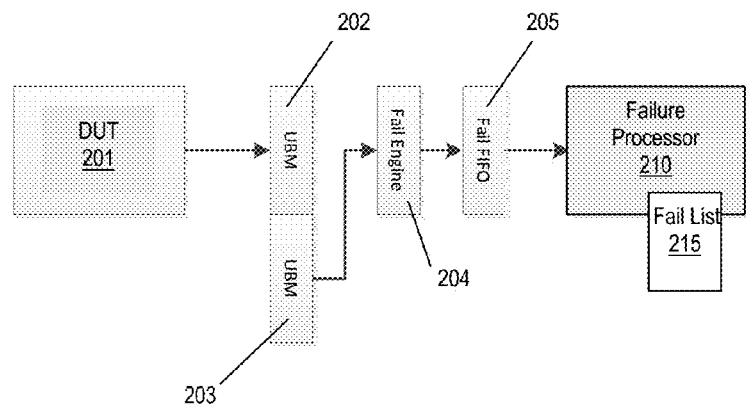
FIG. 2A depicts an example parallel RA system over a first time phase A, according to an embodiment of the present invention.

An example embodiment of the present invention processes multiple memory testing functions substantially in parallel with each other, e.g., contemporaneously, simultaneously, in real time with and/or during the execution of processing directed over or related to each individual test function. For instance, an example embodiment may be implemented in which redundancy analysis (RA) processing is computed over existing (e.g., previously collected) failure related data while the capturing of fresh fail related data from one or more DUTs and generating new fail lists corresponding thereto are in progress. FIG. 2A depicts an example parallel RA system 200 over a first time phase A, according to an embodiment of the present invention.

RA system 200 processes existing (previously collected) failure related data (failure data, fail data) during (at the same time of) its capture of fresh (current) failure data. In an example embodiment, UBM functionality in RA system 200 comprises two (2) independently divided storage banks. A first UBM bank 202 accepts pass/fail or other failure related test data from a DUT 201, such as a NAND flash memory device at a first time $t_0$. Substantially at the same time, a second UBM bank 203 sends pass/fail data collected at an earlier, previous time $t_{-1}$ from the DUT 201 (or e.g., another, previously tested DUT) to a fail engine 204. Thus, as UBM 202 captures the fresh failure data, the UBM 203 transmits the previously captured existing failure data. The UBM bank 202 captures the fresh failure related data from the DUT 201 at full speed and the UBM bank 203 signals transfer of the fail data directly to the fail engine 204.

The fail engine 204 accesses the pass/fail data and generates fail list in parallel with capture of subsequent failure related data from the DUT 201 by the first UBM bank 202. The fail engine 204 may comprise a temporary cache or instance of the existing failure related data accepted from the second UBM 203, e.g., in a ping-pong memory. The fail engine 204 pushes, e.g., outputs the generated fail list to a high speed failure related data-dedicated first-in/first-out (FIFO) buffer 205. The failure list comprises data relating to the location of fails in the main or spare storage areas and maps those listed fail loci to a corresponding address at which they were tested within the DUT.

Figure 2B:
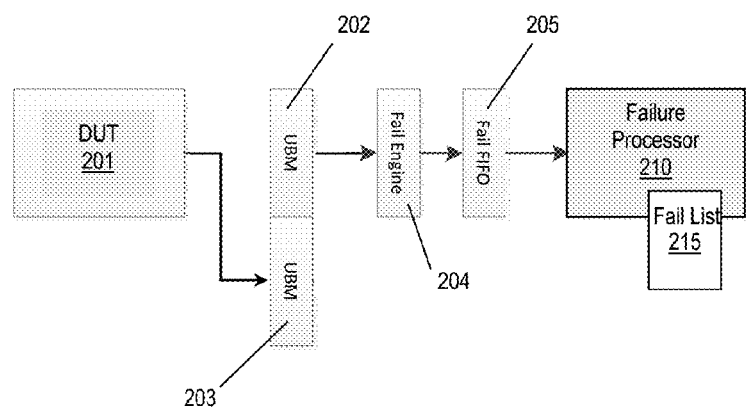
FIG. 2B depicts the example parallel RA system over a second time phase B, according to an embodiment of the present invention.
Figure 2C:
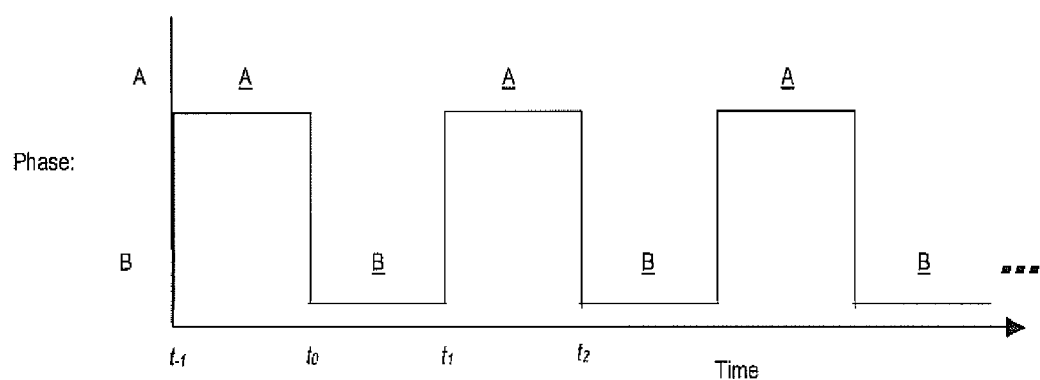
FIG. 2C depicts a timing interrelationship between the time phases A and B of an example parallel RA system phase, according to an embodiment of the present invention.

FIG. 2B depicts the example parallel RA system 200 over a second time phase B, according to an embodiment of the present invention. FIG. 2C depicts a timing interrelationship 250 between the first time phase A and the second time phase B of the example parallel RA system 200, according to an embodiment of the present invention. With reference to FIG. 2A, FIG. 2B and FIG. 2C, the expiration of the first time phase A coincides simultaneously with the beginning of the second time phase B. At these moments $t_0$, $t_1$, $t_2$, $t_3$, $t_4$, $t_5$, . . . , etc., UBM 202 and UBM 203 ping-pong together operably.

An example embodiment may thus be implemented in which, during the times periods corresponding to each phase A, the first UBM 202 captures fresh test data from the DUT 201 while at the same time, the fail engine 204 processes the existing fail data. The fail engine 204 accesses the existing fail data from the second UBM 203, which captured the existing fail data earlier from the DUT 201 during a previous time phase B. For example, during the phase A time period from the time $t_1$ to the time $t_2$, the UBM 202 captures fresh fail data from the DUT 101 and the fail engine 204 processes the existing fail data, which was captured by UBM 203 from the DUT 201 during the previous phase B time period from the time $t_0$ to the time $t_1$.

At the time $t_0$, the UBM 202 and the UBM 203 ping-pong operably and essentially reverse roles in which newer fresh data is then captured by the UBM 203 from the DUT 201 and the existing fresh data, which comprises the data captured just earlier from the time $t_{-1}$, to the time $t_0$, (e.g., "the previous 'fresh' fail data") by the UBM 202, is processed by the fail engine 204. Over the entire time of testing (test time) "Time", the sequence of the time phases A and B repeats continuously, with UBM 202 and UBM 203 sequentially reversing roles operably as ping-pong memories. UBM 203 may mirror UBM 203 as to capacity, addressability and/or format. Over any given test time (test run, test pattern, test input sequence) duration), the duration of each of the time phases A and B may be the same, or may vary by some degree, e.g., as controlled by an ATE master test controller.

An example embodiment may be implemented in which the fail engine 204 (FIG. 2A) may be operable substantially independent of significant software interaction, e.g., with the failure processing module (e.g., failure processor) 210. With reference to FIG. 2A, once it begins accepting the existing failure related data from the second UBM buffer 203, the fail engine 204 remains operable, e.g., in real time, computing the fail lists. The fail engine 204 continues computing a fail list as it may be provided, as long as sufficient space remains in the fail FIFO queue 205 and may continue thus substantially continuously until the end of a test run.

An example embodiment may be implemented in which an optimized interrupt mechanism raises an interrupt over the operation of the fail engine 204 when fail FIFO is 60-66% (approx. ⅔) full. Upon the FIFO fail queue 205 usage falling below approx. one half (50%), the interrupt may reset. Upon a reset, the interrupt remains uncalled unless/until the usage of the fail queue FIFO 205 fills up to 60-66% again, which reduce a number of unproductive, spurious, toggling or hunting interrupt calls, avoids overhead associated with interrupt handling and thus improve overall performance of RA 200.

The failure processor 210 comprises an optimized interrupt mechanism, which may trigger a software read of the output fail list into a failure database which can be accessed for processing repair analysis. As a test run proceeds over time, the failure database may be expected to grow. Memory associated with the fail database of the failure processor 210 comprises a capacity sufficient for storing substantial volumes of fail list data. The transfer path for failure related data in the example system 200 obviates use of an ECR (which e.g., could be expected to demand substantial and continually expanding storage resources over test time) and thus, is simpler and more direct and efficient in relation to serial RA. The fail database is optimized to be space efficient and also allow fast access. With its cooperability with the resources of failure processor 210 may thus comprise a greater storage volume than an ECR, which the system 200 obviates.

In an example embodiment, the fresh failure related data comprise pass/fail and address data collected most recently in real time by the first UBM bank 202 (FIG. 2A). Failure data relate to the test failure of one or more cells of a main storage bank of the NAND flash memory DUT 201. The existing failure related data comprise pass/fail and address data collected previously, at an earlier point in time, by the first UBM bank 202 in relation to the test failure of one or more cells of a main storage bank of the NAND flash memory DUT 201. The UBM 202 thus collects the fresh failure related data from the DUT 201 at a time subsequent to, e.g., after when the existing failure data was captured. For instance, the fresh failure data may be captured from results of a scan pattern input immediately subsequent to an earlier, input, from which the existing failure data resulted.

The fail engine 204 generates the fail list based on the existing failure related data in parallel temporally with the collection of the fresh failure related data from the DUT 201 by the first UBM 202. The fail processor executes software operable for computing an analysis over a redundancy characteristic of the NAND flash memory DUT 201. For example, the fail list computed by the fail engine 204 may comprise pass/fail, address and/or other data in relation to testing the memory cells of a NAND flash main storage bank. The failure processing module (e.g., failure processor) 210 may compute, characterize and evaluate the degree of cell failure in the main storage block, map the replacement of main storage block failed cells to the spare block memory cells with which the failed cells are replaced, compute an optimized replacement of failed main storage block cells and track a degree to which the spare storage block retains an availability of cells for further repair, e.g., for replacing subsequent failures of main block memory cells.

The RA computed by the failure processor 210 evaluates the redundancy characteristic of the DUT by analyzing the growing fail list over the main storage block of the DUT 201 in relation to the resources available in the spare storage block thereof and an efficiency with which it may be configured to optimize the repair of the main storage bank test cells. The failure processor 210 may be programmed with failure processing software. The failure processing software may comprise the failure database, a repair analysis module, a fail list query and a management interface, which supports running an analysis plug-in program preferred by a user. The software may comprise code, stored on a non-transitory computer-readable medium. The code, when executed by the failure processor 210, may cause or control the performance of a RA process.

Thus, an example embodiment of the present invention is described in relation to testing memory devices with parallel processing operations. An RA system, e.g., incorporated as a component of an ATE platform, performs parallel redundancy analysis (RA) over NAND flash memory devices under test (DUTs). The RA system comprises a first unified buffer memory (UBM) bank, which captures fresh failure related data from a DUT. A second UBM bank transfers existing failure related data to a fail engine, which accepts the transferred existing failure related data and generates a failure list therewith. The transferring/accepting the existing failure related data and/or the generating the failure list is performed substantially in parallel, e.g., temporally, with the first UBM bank during the capturing of the fresh failure related data. The generated failure list is FIFO-queued and a failure processor computes RA based on the queued failure list. The RA may also be performed in parallel with the capturing of the fresh data.

Example RA Process

Figure 3:
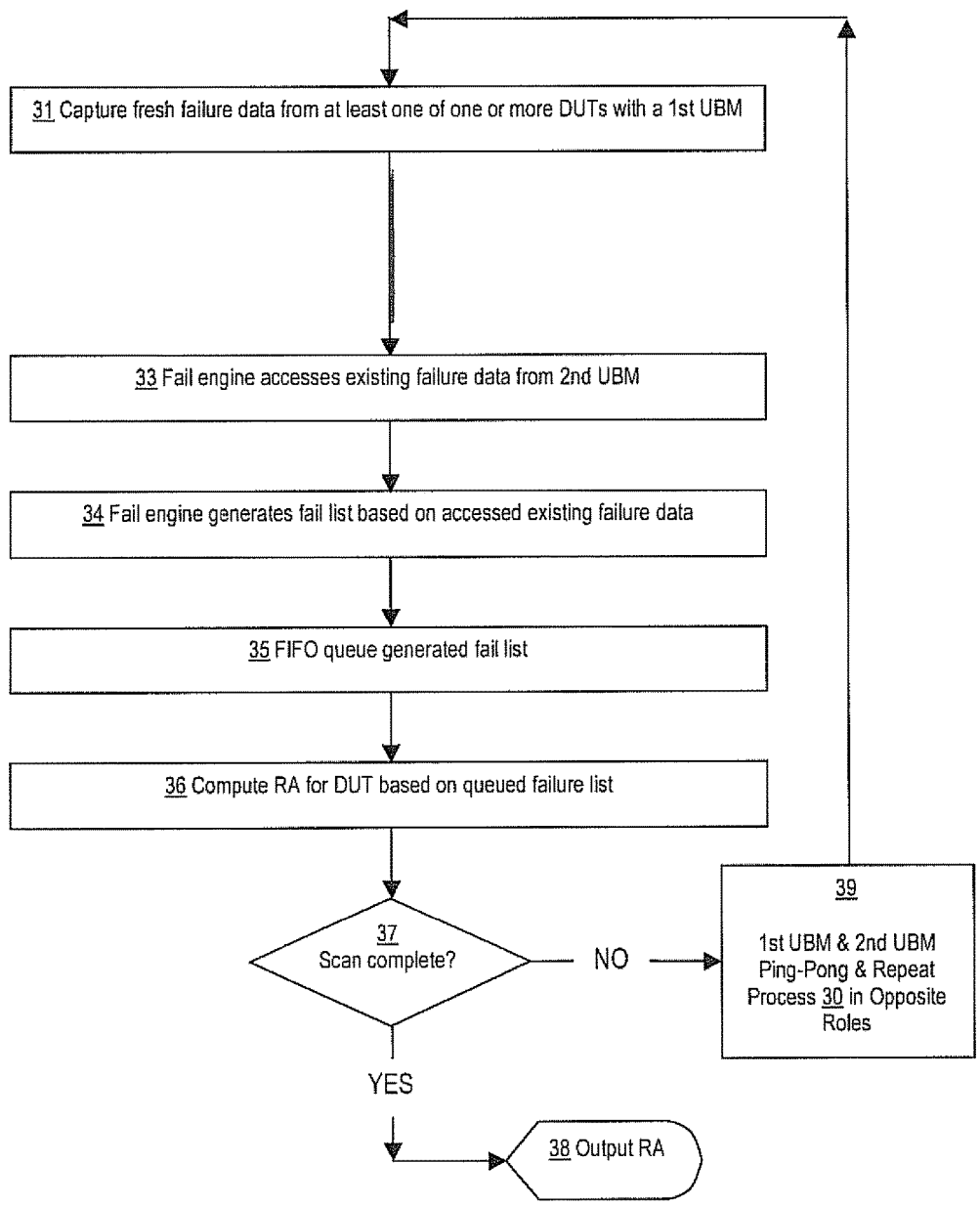
FIG. 3 depicts a flowchart for an example parallel RA process, according to an embodiment of the present invention.

FIG. 3 depicts a flowchart for an example parallel RA process 30, according to an embodiment of the present invention. In step 31, fresh failure related data is captured from at least one of one or more devices under test with a first buffer memory (e.g., UBM).

In step 33, a fail engine accesses the existing failure related data stored in the second UBM. In step 34, the fail engine generates a failure list based on the accessed existing failure related data. The failure list thus caches a state of the second UBM, which is reflected by the existing failure related data. The listed failures relate to the location of fails in the main or spare storage areas and maps those listed fail loci to a corresponding address at which they were tested within the DUT.

In step 35, the generated failure list is queued for subsequent processing on a FIFO basis. In step 36, a redundancy analysis is computed for the DUT based on the queued failure list.

In step 37, it is determined whether a test scan over the DUT is complete. If so, them in step 38, the RA may be output reflecting completed test results over the DUT. If not, then in step 39 the first UBM and the second UBM ping-pong and effectively reverse roles. Upon the first UBM and the second UBM ping-ponging and reversing roles, process 30 may repeat commencing again at step 31, now however with the second UBM operable as recited above in relation to the first UBM and with the first UBM now operable as recited above in relation to the second UBM. Process 30 may be repeated in a subsequent iteration with a capture of new fresh failure related data, by the second UBM, etc.

For example, a test controller (e.g., failure processor 210; FIG. 2) may control a progressive scan over one or more DUTs in which a new test pattern input is applied to the memory cells of the DUTs, upon completing a fail list based on an earlier capture of failure related data. At a time over a time period spanning the time $t_1$ to the time $t_2$ (FIG. 2C) for example, the fresh failure related data is captured from the DUT by the first UBM and the second UBM transmits the existing failure related data a previous DUT test. The existing failure related data was captured just earlier, over the previous time period spanning the time $t_0$ to the time $t_1$. Contemporaneous with the capture of the fresh failure related data by the first UBM over the phase A time period (FIG. 2A) spanning for example from the $t_1$ to the time $t_2$ (or over any phase A over the span of test time T; FIG. 2C):

The second UBM transmits the existing failure related data from the DUT;

The failure engine accesses the stored existing failure related data from the second UBM, generates the fail list and queues the generated fail list; and/or The failure processor computes the RA based on the fail list generated from the existing failure data.

If the scan is complete, the completed RA may be displayed as an output for the one or more DUTs. If however the scan is not yet compete, then newer fresh data is captured at a subsequent time $T_2$, which is after time $T_1$. Thus, the failure related data captured at time $T_1$ becomes the existing failure related data in a subsequent iteration of process 30 steps.

An example embodiment may be implemented in which the RA process 30 is controlled with one or more non-transitory computer readable storage media comprising instructions for causing one or more processors to perform computations relating to a analyzing the redundancy characteristics of the NAND flash memory DUTs. For example, the failure processor may control, program or configure, to process the computations for evaluating the redundancy characteristics of the one or more DUTs, one or more operations of the FIFO queue, the fail engine and/or one or both of the first and second UBMs.

Thus, an example embodiment of the present invention is described in relation to testing memory devices with parallel processing operations. An ATE system performs RA over one or more NAND flash memory DUTs. An embodiment of the present invention relates to testing memory devices with parallel processing operations. An automated test equipment (ATE) system performs redundancy analysis (RA) over one or more NAND flash memory devices under test (DUTs). A first unified buffer memory (UBM) bank captures and stores fresh (e.g. current) failure related data from a DUT. A second UBM bank transmits existing failure related data, which it captured previously at an earlier point in time from the DUT. A fail engine accesses the stored existing failure related data from the second UBM and generates a failure list based thereon. The generated failure list is queued (e.g., with a FIFO queue). A failure processing module (e.g., failure processor) computes a RA based on the queued failure list. The failure processor may also control or program the capturing of the failure related data (e.g., a scan over the DUTs, in which a test pattern input to the NAND memory cells generate the failure related data in relation thereto). The first UBM bank and the second UBM bank then switch roles, e.g., ping-pong.

Thus, an example embodiment of the present invention improves the performance of a memory test system without adding expense and complexity of additional, dedicated processor hardware. An example embodiment is operable for improving the speed and throughput of RA without requiring a dedicated additional or external processor or other components in its computation. An example embodiment also eliminates the need for large test system memory to store the entire contents read out from a DUT at one time.

Definitions that are expressly set forth in each or any claim specifically or by way of example herein, for terms contained in relation to features of such claims are intended to govern the meaning of such terms. Thus, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A system for testing a device under test (DUT), the system comprising:
a first buffer memory bank operable for capturing fresh failure related data from the device under test at a first time;
a second buffer memory bank operable for transmitting existing failure related data from a previous DUT test, which precedes the first time;
a fail engine operable for accessing the existing failure related data and for generating a failure list based thereon, wherein one or more of the receiving the existing failure related data, the accessing the existing failure related data, and the generating the failure list, is performed contemporaneously in relation to the capturing the fresh failure related data;
a queue operable for queuing a generated failure list; and
a failure processor operable for controlling the capturing and for computing a redundancy analysis based on a queued failure list.

2. The system as recited in claim 1, wherein the DUT comprises a NAND flash memory device.

3. The system as recited in claim 1 wherein the queue comprises a FIFO (first-in/first-out) queue structure.

4. The system as recited in claim 1 wherein the first buffer memory bank and the second buffer memory bank operate in a ping-pong manner.

5. The system as recited in claim 1, wherein the fail engine remains operable during a test run unless an interrupt is raised over an operation of the failure engine, and further comprising an interrupt mechanism operable for processing the interrupt.

6. The system as recited in claim 5 wherein the interrupt mechanism is configured to raise the interrupt based on a current fail list storage capacity of the FIFO queue structure.

7. The system as recited in claim 6 wherein the interrupt mechanism is configured to raise the interrupt over responsive to the current fail list storage capacity of the FIFO queue structure reaching approximately two thirds of a total capacity of the FIFO queue structure.

8. The system as recited in claim 7 wherein after raising the interrupt, the interrupt mechanism is configured to reset the interrupt responsive to the current fail list storage capacity of the FIFO queue structure falling to or below approximately one half of the total capacity of the FIFO queue structure.

9. The system as recited in claim 8 wherein after resetting the interrupt, the interrupt is suppressed until the current fail list storage capacity rises subsequently to the approximately two thirds of the total capacity of the FIFO queue structure.

10. The system as recited in claim 2 wherein the NAND memory device comprises a main storage block of a plurality of individually addressable memory cells and a spare storage block of a plurality of individually addressable memory cells wherein, and wherein responsive to a failure of one or more cells of the main storage block, the NAND memory device is operable to address one or more of the plurality of individually addressable memory cells of the spare storage block to each replace one of the one or more failed cells of the main storage block.

11. The system as recited in claim 10 wherein one or more of the failure related data and the fail list relates to a location of one or more failed cells of the main storage block or the spare storage block and a mapping between locations of the one or more failed cells and a corresponding address at which the one or more failed cells were tested within the DUT.

12. The system as recited in claim 11 wherein the generating the failure list comprises detecting one or more failed cells in the main storage block or spare storage block, wherein the failure list comprises information related to the mapping.

13. The system as recited in claim 1, wherein the DUT comprises a NAND flash memory device, wherein the queue comprises a FIFO (first-in/first-out) queue structure, and wherein the first buffer memory bank and the second buffer memory bank ping-pong in operation.

14. A method for analyzing a redundancy characteristic of one or more devices under test, the method comprising:
  capturing fresh failure related data from at least one of the one or more devices under test with a first buffer memory at a first time;
  transmitting, from a second buffer memory, existing failure related data, which was captured from the device under test at a previous time, which precedes the first time;
  accessing the existing failure related data;
  generating a failure list based on the accessed existing failure related data, wherein one or more of the receiving the existing failure related data, the accessing the existing failure related data, or the generating the failure list, is performed in parallel contemporaneously in relation to the capturing the fresh failure related data;
  queuing a generated failure list; and
  computing a redundancy analysis based on a queued failure list.

15. The method as recited in claim 14, further comprising controlling a test routine conducted over each of the one or more devices under test.

16. The method as recited in claim 15 wherein the controlling the test routine comprises scanning each of the one or more devices under test.

17. The method as recited in claim 16 wherein the scanning each of the one or more devices under test comprises the capturing the fresh failure related data.

18. The method as recited in claim 14 wherein each of the one or more devices under test comprises a NAND flash memory device.

19. A method for analyzing a redundancy characteristic of one or more devices under test, the method comprising:
  capturing fresh failure related data from at least one of the one or more devices under test with a first buffer memory at a first time;
  transmitting, from a second buffer memory, existing failure related data, which was captured from the device under test at a previous time, which precedes the first time, wherein the first buffer memory and the second buffer memory alternate in storing freshly captured failure related data;
  accessing the existing failure related data;
  generating a failure list based on the accessed existing failure related data, wherein one or more of the receiving the existing failure related data, the accessing the existing failure related data, or the generating the failure list, is performed in parallel contemporaneously in relation to the capturing the fresh failure related data;
  queuing a generated failure list; and
  computing a redundancy analysis based on a queued failure list.

20. The method as recited in claim 19, wherein the one or more devices under test comprises a NAND memory device.

* * * * *